United States Patent
Huang et al.

(10) Patent No.: US 6,348,371 B1
(45) Date of Patent: Feb. 19, 2002

(54) METHOD OF FORMING SELF-ALIGNED TWIN WELLS

(75) Inventors: Chih-Feng Huang, Chu-Pei; Kuo-Su Huang; Shun-Liang Hsu, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/809,831

(22) Filed: Mar. 19, 2001

(51) Int. Cl.$^7$ .......................................... H01L 21/8238
(52) U.S. Cl. .................. 438/218; 438/225; 438/228; 438/229; 438/232
(58) Field of Search ................................ 438/218, 225, 438/228, 229, 232

(56) References Cited

U.S. PATENT DOCUMENTS

| | | | |
|---|---|---|---|
| 3,865,654 A | 2/1975 | Chang et al. | 148/187 |
| 4,434,543 A | 3/1984 | Schwabe et al. | 29/576 B |
| 4,435,895 A | 3/1984 | Parrillo et al. | 29/571 |
| 5,525,535 A | * 6/1996 | Hong | |
| 5,698,458 A | * 12/1997 | Hsue et al. | |
| 5,766,970 A | 6/1998 | Kim et al. | 437/57 |
| 5,929,493 A | 7/1999 | Wu | 257/369 |
| 5,994,190 A | * 11/1999 | Hashimoto | |
| 6,309,921 B1 | * 10/2001 | Ema et al. | |

* cited by examiner

Primary Examiner—John F. Niebling
Assistant Examiner—Josetta Jones
(74) Attorney, Agent, or Firm—George O. Saile; Stephen B. Ackerman

(57) ABSTRACT

A process for forming self-aligned, twin well regions for a CMOS device, without the use of an oxidation retarding silicon nitride layer, has been developed. A first ion implantation procedure is used to place N type ions in a first portion of a semiconductor substrate, followed by a wet thermal oxidation procedure resulting in the growth of a thick silicon dioxide layer on the N type ions, in the first portion of the semiconductor substrate, while growing a thin silicon dioxide layer on a second portion of the lightly doped, P type semiconductor substrate. A second ion implantation procedure places P type ions through the thin silicon dioxide layer, into the second portion of the semiconductor substrate, while the thick silicon dioxide layer prevents the P type ions from reaching the first portion of the semiconductor substrate. A subsequent anneal procedure results in the formation of a N well region, in the first portion of the semiconductor substrate, self-aligned to the formed P well region, located in the second portion of the semiconductor substrate.

19 Claims, 2 Drawing Sheets

METHOD OF FORMING SELF-ALIGNED TWIN WELLS

BACKGROUND OF THE INVENTION (1) Field of the Invention

This invention relates to methods used to fabricate semiconductor devices and more specifically to a method used to form well regions for N channel, and for P channel, metal oxide semiconductor field effect transistors.

(2) Description of Prior Art

The advent of complimentary metal oxide semiconductor (CMOS), technology, featuring N channel (NFET), and P channel (PFET), devices, on the same semiconductor chip, created the need for twin wells, specifically an N well region to accommodate the PFET devices, and a P well region for the NFET devices. To satisfy density, as well as performance requirements, it is imperative that the twin well regions be self-aligned, minimizing the area needed for these regions, as well as minimizing the distance between the conductive structures used for communication between the different type devices. One method of satisfying the self-alignment requirement is the formation of a first well region, such as the N well region for the PFET or PMOS type devices, in a region of a semiconductor substrate exposed in an opening formed in an overlying silicon nitride layer. This is followed by an oxidation procedure which results in a thick silicon dioxide layer on the N well region, while silicon dioxide growth is retarded by the silicon nitride layer overlying a region of a lightly doped, P type semiconductor substrate, to be used to subsequently accommodate the P well region. After removal of the silicon nitride layer an ion implantation procedure is employed to place the P type ions, needed for formation of the P well region, into the portion of the semiconductor substrate not blocked by the thick silicon dioxide layer, located overlying the N well region, thus self-alignment of the twin wells is realized.

The present invention will describe a novel procedure for forming self-aligned, twin well regions, without the use of silicon nitride, thus reducing process costs, as well as avoiding the process complexity of depositing, patterning, and removing silicon nitride. This invention will feature the different oxidation rates of N type doped silicon, and lightly doped P type silicon, to achieve an non-silicon nitride procedure for formation of self-aligned twin wells. Prior art, such as Kim et al, in U.S. Pat. No. 5,766,970, as well as Schwabe et al, in U.S. Pat. No. 4,434,543, describe methods for obtaining self-aligned twin well regions, however these prior arts feature the use of a patterned, silicon nitride layer, to accomplish the self-aligned objective.

SUMMARY OF THE INVENTION

It is an object of this invention to form twin well regions, to accommodate CMOS designs comprised of PFET as well NFET devices.

It is another object of this invention to form the twin well regions for CMOS designs, employing procedures resulting in self-aligned twin well regions.

It is still another object of this invention to minimize fabrication cost, and reduce process complexity, via forming self-aligned twin well regions, without the use of a patterned silicon nitride layer, as an oxidation retarding mask.

In accordance with the present invention a method of forming self-aligned, twin well regions in a semiconductor substrate, via use of differential oxidation rates on specifically doped regions, without the use of a silicon nitride, oxidation retarding layer, is described. A photoresist shape is used as a mask to allow N type ions to be implanted into first region of the semiconductor substrate, exposed in an opening in the photoresist shape. A thermal oxidation procedure is then employed resulting a thick silicon dioxide formation, on the first region of the semiconductor substrate, with a N well region formed directly underlying the thick silicon dioxide layer. A thinner silicon dioxide layer is formed on second regions of the P type, semiconductor substrate. A second ion implantation procedure is performed to allow P type ions to be implanted through the thinner silicon dioxide layer, into second regions of the semiconductor substrate, while the thicker silicon dioxide layer prevents the P type implantation from entering the N well region. An anneal procedure is then used to activate the P type ions, resulting in P well regions located in second regions of the semiconductor substrate, self-aligned to the N well region, located in the first region of the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
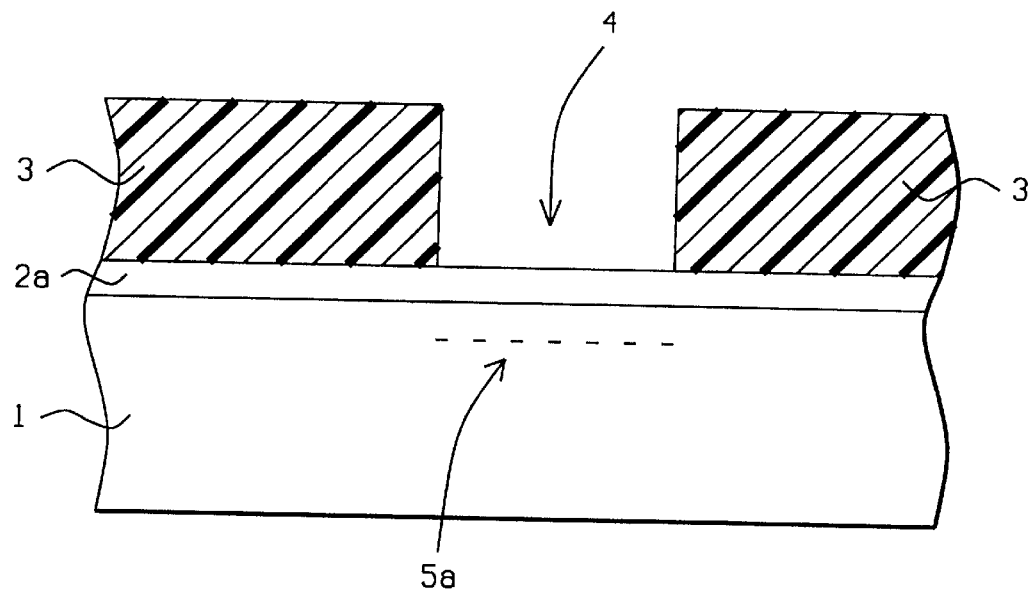
FIGS. 1–5, which schematically, in cross-sectional style, describe key stages of fabrication used to form self-aligned twin regions in a semiconductor substrate, via use of differential oxidation rates on specifically doped regions, without the use of a silicon nitride as an oxidation retarding layer.

The method of forming self-aligned twin regions in a semiconductor substrate, via use of differential oxidation rates, used to form thick and thin silicon dioxide regions, on specifically doped regions, without the use of a silicon nitride layer as an oxidation retarding layer, will now be described in detail. A P type, semiconductor substrate 1, comprised of single crystalline silicon, with a <100> crystallographic orientation is used and schematically shown in FIG. 1. Semiconductor substrate 1, is comprised with a resistivity between about 8 to 12 ohm-cm. Silicon dioxide layer 2a, is next formed at a thickness between about 150 to 250 Angstroms, via thermal oxidation procedures. Silicon dioxide layer 2a, will be used as a pad or screen oxide layer to prevent heavy metal ions from entering portions of the underlying semiconductor substrate during subsequent ion implantation procedures, performed through silicon dioxide layer 2a, into specific regions of semiconductor substrate 1. Photoresist shape 3, is next formed on silicon dioxide layer 2a, with opening 4, exposing a portion of semiconductor substrate 1, (underlying silicon dioxide layer 2a), to be used to accommodate an N well region. A first ion implantation procedure is then performed, using arsenic or phosphorous ions, at an energy between about 80 to 120 KeV, and at a dose between about 4 E15 to 6 E15 atoms/cm$^2$, resulting in N type layer 5a, comprised of unactivated N type ions, located in a first region of semiconductor substrate 1. This is schematically shown in FIG. 1.

Figure 2:
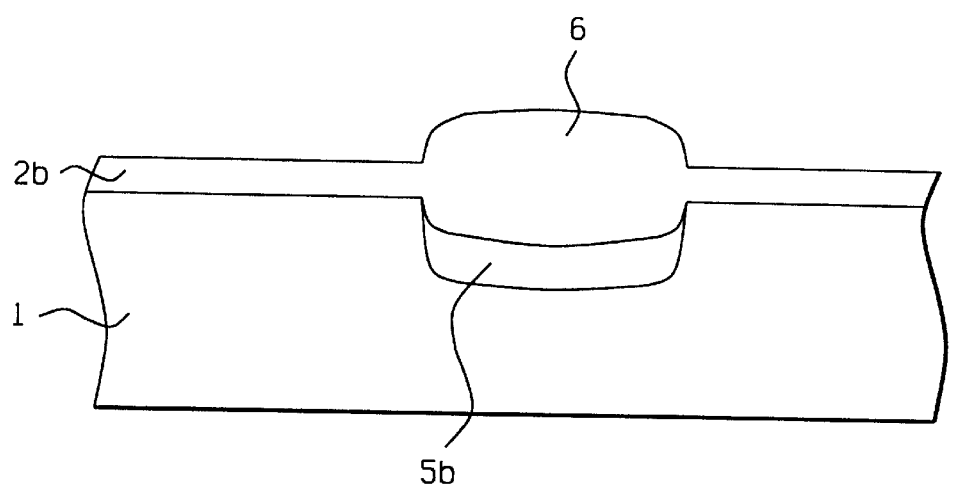

After removal of photoresist shape 3, via plasma oxygen ashing and careful wet cleans, a thermal oxidation procedure is performed at a temperature between about 960 to 1000° C., in a oxygen—steam ambient. The thermal oxidation procedure results in the formation of silicon dioxide layer 6, at a thickness between about 4500 to 5500 Angstroms, in the first region of semiconductor substrate 1. The presence of N type layer 5a, enhanced the oxidation rate, when compared to thicknesses obtained via thermal oxidation of less doped regions, resulting in the desired thickness of silicon dioxide layer 6, as well as activating the N type ions, in N type layer 5a, thus resulting in initial N well region 5b, located directly underlying silicon dioxide layer 6. The same thermal oxidation procedure also results in the growth of silicon dioxide layers 2b, on second regions of semiconductor substrate 1, to be subsequently used for P well regions. The lighter concentration of dopant in P type semiconductor substrate 1, when compared to the heavier dopant concentration of N type layer 5a, resulting in a thickness for silicon dioxide layers 2b, between about 750 to 1250 Angstroms. The result of these procedures are schematically shown in FIG. 2.

Figure 3:
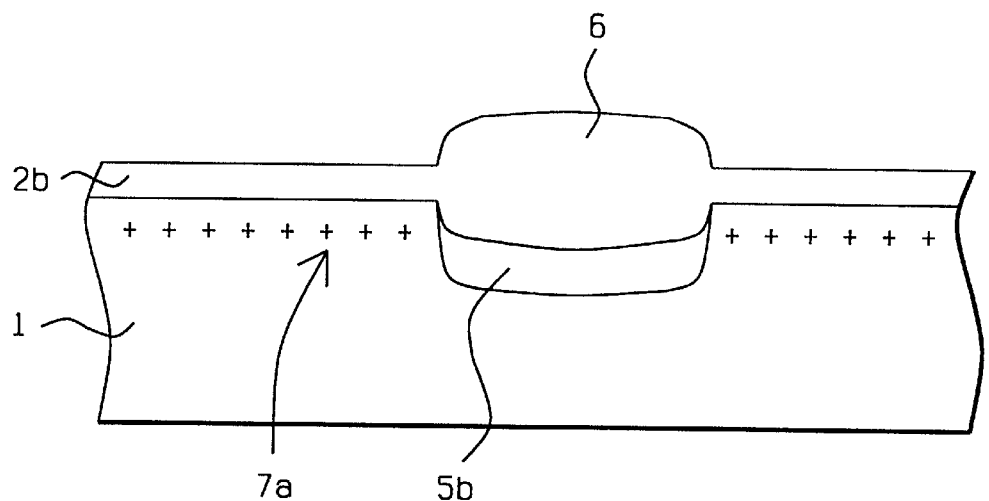

A second ion implantation procedure, using boron or $BF_2$ ions, at an energy between about 45 to 55 KeV, and at a dose between about 2E13 to 4E13 atoms/cm$^2$, is next performed, through silicon dioxide layers 2b, to create P type layer 7a, in second portions of semiconductor substrate 1, or in portions of semiconductor substrate 1, not covered by silicon dioxide layer 6. The thickness of silicon dioxide layer 6, as well as the energy of the second ion implantation procedure, prevented implantation into the first region of semiconductor substrate 1, or into initial N well region 5b. In addition the blocking characteristics of thicker dioxide layer 6, allowed self-alignment of P type layer 7a, to initial N well region 5b, to be realized. The result of this procedure is shown schematically in FIG. 3.

Figure 4:
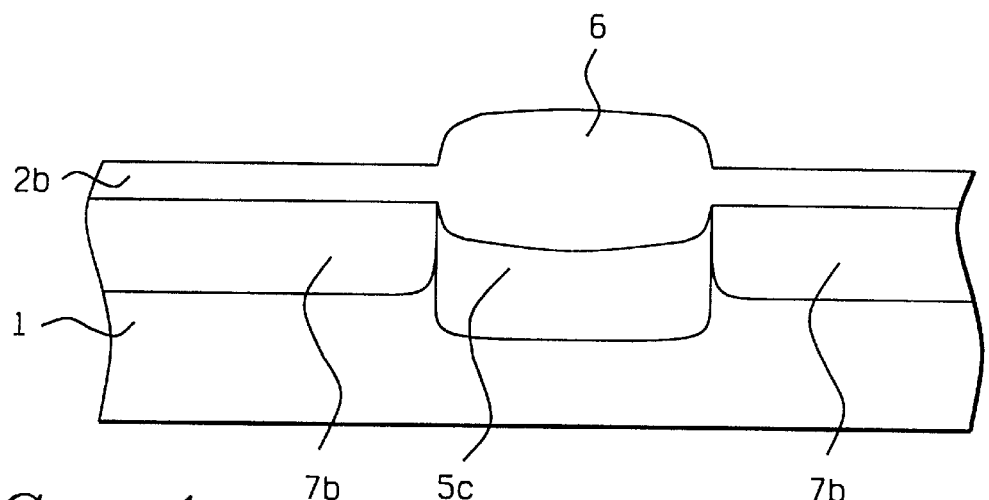
Figure 5:
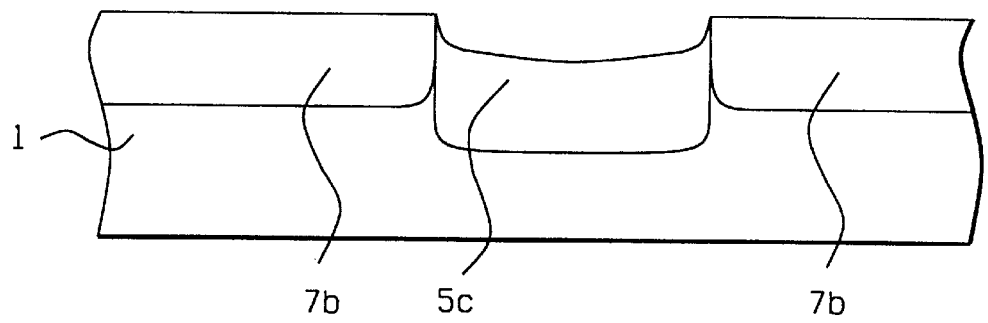

An anneal procedure is next performed in either a conventional furnace, or via a rapid thermal anneal procedure, at a temperature between about 1000 to 1200° C., in an nitrogen or argon ambient, resulting in activation of the P type ions, in P type layer 7a, creating P well regions 7b. The same anneal procedure also results in additional drive-in for the N type dopants in initial N well region 5b, resulting in final N well region 5c. The self-alignment of P well regions 7b, to final N well region 5c, can be schematically observed in FIG. 4. Finally silicon dioxide layer 6, as well as silicon dioxide layer 2b, are selectively removed via wet procedures using a dilute of buffered HF solution as an etchant. Final N well region 5c, is now available to accommodate PFET devices, while P well regions 7b, are now ready to accommodate the NFET elements of the CMOS device.

While this invention has been particularly shown and described with reference to, the preferred embodiments thereof, it will be understood by those skilled in the art that various changes in form and details may be made without departing from the spirit and scope of this invention.

What is claimed is:

1. A method of forming self-aligned, twin well regions, in a semiconductor substrate, comprising the steps of:

growing a first insulator layer on said semiconductor substrate;

performing a first ion implantation procedure through said first insulator layer, into a first region of said semiconductor substrate, to form a first conductivity type ion layer;

performing a thermal oxidation procedure to grow a second insulator layer on said first region of said semiconductor substrate, resulting in formation of an initial first conductivity type well region in said first region of said semiconductor substrate, directly underlying said second insulator layer, and growing a third insulator layer on second region of said semiconductor substrate, with said third insulator layer smaller in thickness than said second insulator layer;

performing a second ion implantation procedure through said third insulator layer, into a second region of said semiconductor substrate, to form a second type conductivity ion layer;

performing an anneal cycle to form a final first conductivity well region in said first region of said semiconductor substrate, directly underlying said second insulator layer, and forming a final second conductivity well region in said second region of said semiconductor substrate, directly underlying said third insulator layer, and with said final second conductivity well region self-aligned to said final first conductivity well region; and removing said second insulator layer, and said third insulator layer.

2. The method of claim 1, wherein said first insulator is a silicon dioxide layer, obtained via thermal oxidation procedures at a thickness between about 150 to 250 Angstroms.

3. The method of claim 1, wherein said first ion implantation procedure is performed using arsenic or phosphorous ions, implanted at an energy between about 80 to 120 KeV, at a dose between about 4E16 to 6E16 atoms/cm$^2$.

4. The method of claim 1, wherein said first type conductivity ion layer is an N type layer, comprised of arsenic or phosphorous ions.

5. The method of claim 1, wherein said second insulator layer is a silicon dioxide layer, at a thickness between about 4500 to 5500 Angstroms, obtained said thermal oxidation procedure, performed at a temperature between about 960 to 1000° C., in an oxygen—steam ambient.

6. The method of claim 1, wherein said third insulator layer is a silicon dioxide layer, at a thickness between about 750 to 1250 Angstroms, obtained said thermal oxidation procedure.

7. The method of claim 1, wherein said second ion implantation procedure is performed using boron or $BF_2$ ions, implanted at an energy between about 45 to 55 KeV, at a dose between about 2E13 to 4E13 atoms/cm$^2$.

8. The method of claim 1, wherein said second type conductivity ion layer is a P type layer, comprised of boron ions.

9. The method of claim 1, wherein said anneal procedure is performed using a conventional furnace or using rapid thermal anneal procedures, at a temperature between about 1000 to 1200° C., in a nitrogen or in an argon ambient.

10. The method of claim 1, wherein said final first conductivity well region is an N well region.

11. The method of claim 1, wherein said final second conductivity well region is a P well region.

12. A method of forming twin well regions in a semiconductor substrate, featuring self-alignment of an N well region, to a P well region, accomplished without the use of an oxidation retarding silicon nitride layer, comprising the steps of:

growing a silicon dioxide screen layer on said semiconductor substrate;

forming a photoresist shape on said silicon dioxide screen layer, with an opening in said photoresist shape exposing a portion of said silicon dioxide screen layer which In turn resides on a first portion of said semiconductor substrate;

performing a first ion implantation procedures to implant N type ions through said silicon dioxide screen layer exposed in said opening in said photoresist shape, placing said N type ions in said first portion of said semiconductor substrate;

performing a thermal oxidation procedure creating a thick silicon dioxide layer on said first portion of said semiconductor substrate, while creating a thin silicon dioxide layer on a second portion of said semiconductor substrate, not occupied with said N type ions, and with said oxidation procedure activating said N type ions in said first portion of said semiconductor substrate;

performing a second ion implantation procedure to implant P type ions, through said thin silicon dioxide layer, into said second portion of said semiconductor substrate, while said thick silicon dioxide layer prevents said P type ions from entering said first portion of said semiconductor substrate;

performing an anneal cycle to form said N well region, from said N type ions, in said first portion of said semiconductor substrate, while forming said P well region, from said P type ions, in said second portion of said semiconductor substrate, with said N well region self-aligned to said P well region; and removing said thin silicon dioxide layer and said thick silicon dioxide layer.

13. The method of claim 12, wherein said silicon dioxide screen layer is obtained via thermal oxidation procedures at a thickness between about 150 to 250 Angstroms.

14. The method of claim 12, wherein said first ion implantation procedure is performed using arsenic or phosphorous ions, implanted at an energy between about 80 to 120 KeV, at a dose between about 4E16 to 6E16 atoms/cm$^2$.

15. The method of claim 12, wherein said thermal oxidation procedure is performed at a temperature between about 960 to 1000° C., in an oxygen—steam ambient.

16. The method of claim 12, wherein said thick silicon dioxide layer, obtained via said thermal oxidation procedure, is obtained at a thickness between about 4500 to 5500 Angstroms.

17. The method of claim 12, wherein said thin silicon dioxide layer, obtained via said thermal oxidation procedure, is obtained at a thickness between about 750 to 1250 Angstroms.

18. The method of claim 12, wherein said second ion implantation procedure is performed using boron or $BF_2$ ions, implanted at an energy between about 45 to 55 KeV, at a dose between about 2E13 to 4E13 atoms/cm$^2$.

19. The method of claim 12, wherein said anneal procedure is performed using a conventional furnace or using rapid thermal anneal procedures, at a temperature between about 1000 to 1200° C., in a nitrogen or in an argon ambient.

* * * * *